(12) United States Patent
Zamsky et al.

(10) Patent No.: US 11,036,403 B2
(45) Date of Patent: Jun. 15, 2021

(54) SHARED MEMORY BLOCK CONFIGURATION

(71) Applicant: Marvell World Trade Ltd., St. Michael (BB)

(72) Inventors: Ziv Zamsky, Raanana (IL); Ilan Mayer-Wolf, Tel-Aviv (IL)

(73) Assignee: Marvell Asia Pte, Ltd., Singapore (SG)

( * ) Notice: Subject to any disclaimer, the term of this patent is extended or adjusted under 35 U.S.C. 154(b) by 44 days.

(21) Appl. No.: 16/526,932

(22) Filed: Jul. 30, 2019

(65) Prior Publication Data

US 2020/0034054 A1    Jan. 30, 2020

Related U.S. Application Data

(60) Provisional application No. 62/712,066, filed on Jul. 30, 2018.

(51) Int. Cl.
G06F 12/00    (2006.01)
G06F 3/06     (2006.01)
H04L 12/933   (2013.01)

(52) U.S. Cl.
CPC ............ *G06F 3/0626* (2013.01); *G06F 3/064* (2013.01); *G06F 3/0631* (2013.01); *G06F 3/0659* (2013.01); *G06F 3/0673* (2013.01); *H04L 49/103* (2013.01)

(58) Field of Classification Search
CPC ...... G06F 3/0626; G06F 3/064; G06F 3/0659; G06F 3/0673; H04L 49/103
See application file for complete search history.

(56) References Cited

U.S. PATENT DOCUMENTS 7,765,328 B2    7/2010  Bryers et al.
7,924,860 B1    4/2011  Frailong et al.
8,111,690 B2    2/2012  Hussain et al.
(Continued)

FOREIGN PATENT DOCUMENTS

WO    WO-1999/007180    2/1999

OTHER PUBLICATIONS

International Search Report and Written Opinion in International Patent Application No. PCT/IB2019/056514, dated Nov. 20, 2019 (12 pages).

(Continued)

Primary Examiner — John A Lane

(57) ABSTRACT

A network switch device is described. The network switch device includes a plurality of processor devices configured to perform different respective functions of the network switch device, a block of shared memory having a plurality of single port memory banks, and a memory controller configured to allocate respective sets of banks among the single port memory banks to processor devices among the plurality of processor devices, and determine respective configurations of the sets of memory banks as one of i) a single port configuration in which respective single port memory banks support a single read or write memory operation to a memory location in a memory access cycle, and ii) a virtual multi-port configuration in which respective single port memory banks support two or more concurrent read or write memory operations to a same memory location, based on memory access requirements of the corresponding processor device.

19 Claims, 4 Drawing Sheets

(56) References Cited

U.S. PATENT DOCUMENTS

| | | |
|---|---|---|
| 8,514,651 B2 | 8/2013 | Levy et al. |
| 8,725,873 B1 | 5/2014 | Bromberg |
| 9,118,576 B2 | 8/2015 | Roitshtein |
| 9,129,661 B2 | 9/2015 | Jain et al. |
| 9,455,907 B1 | 9/2016 | Shumsky et al. |
| 9,467,399 B2 | 10/2016 | Wohlgemuth et al. |
| 9,479,620 B2 | 10/2016 | Levy et al. |
| 9,766,978 B2 | 9/2017 | Kittner |
| 10,089,018 B2 | 10/2018 | Bromberg et al. |
| 10,387,322 B2 | 8/2019 | Bromberg et al. |
| 2012/0127818 A1 | 5/2012 | Levy et al. |
| 2014/0169378 A1 | 6/2014 | Shumsky et al. |
| 2014/0177324 A1* | 6/2014 | Liu .................. G11C 8/16 365/154 |
| 2014/0177470 A1 | 6/2014 | Roitshtein et al. |
| 2014/0192815 A1 | 7/2014 | Shumsky et al. |
| 2014/0244815 A1 | 8/2014 | Bhardwaj |
| 2015/0071079 A1 | 3/2015 | Kadosh et al. |
| 2016/0320989 A1 | 11/2016 | Bromberg et al. |
| 2017/0364408 A1 | 12/2017 | Sherman et al. |
| 2018/0150253 A1* | 5/2018 | Chen .................. G06F 12/0607 |

OTHER PUBLICATIONS

Shpiner et al., "Reducing the Reordering Delay in Multi-Core Network Processors," Technical Report TR12-01, Comnet, Technion, Israel, undated (12 pages).

\* cited by examiner

SHARED MEMORY BLOCK CONFIGURATION

CROSS-REFERENCES TO RELATED APPLICATIONS

This application claims the benefit of U.S. Provisional Patent App. No. 62/712,066, entitled "Flexible Memory Design for Shared Memory," filed on Jul. 30, 2018, the disclosure of which is hereby expressly incorporated herein by reference in its entirety.

FIELD OF THE DISCLOSURE

The present disclosure relates generally to communication networks and, more particularly, to configurable shared memory suitable for network devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Some network devices, such as network switches, bridges, routers, etc., employ multiple processor engines to concurrently process multiple packets with high throughput. The processor devices utilize memory banks to provide various functions of the network switch device, for example, longest exact match engines for routing, forwarding table lookups that determine egress ports for packets, packet buffers that store packets while processing is performed, and hash engines that determine hash outputs.

In various network devices, an effort is made to design systems having shared memory space which is shared among different processor engines. Some memory banks are provided with a single physical port ("single port memory"), which generally allows for one memory access per clock cycle, while other memory banks are provided with two or more physical ports ("dual port memory" or "multi-port memory"), which generally allow for two or more memory accesses per clock cycle. In some systems the memory ports are physical, while in other systems single port memory devices are adapted to provide virtual dual port or multi-port capabilities. However, dual port and multi-port memories, whether the ports are physical or virtual, typically have a higher cost and/or complexity and/or reduced capacity in comparison to single port memories, thus dual port and multi-port memories are less desirable in some scenarios, particularly when their additional capability is not necessary for a particular application.

SUMMARY

In an embodiment, a network switch device includes a plurality of processor devices, a block of shared memory having a plurality of single port memory banks, and a memory controller. The plurality of processor devices are configured to perform different respective functions of the network switch device. The block of shared memory is shared among the plurality of processor devices. The memory controller configured to allocate respective sets of banks among the plurality of single port memory banks to processor devices among the plurality of processor devices, and determine respective configurations of the sets of memory banks as one of i) a single port configuration in which respective single port memory banks support a single read or write memory operation to a memory location in a memory access cycle, and ii) a virtual multi-port configuration in which respective single port memory banks support two or more concurrent read or write memory operations to a same memory location, based on memory access requirements of the corresponding processor device.

In another embodiment, a method for providing access to a block of shared memory having a plurality of single port memory banks includes: allocating, by a memory controller of a network switch device that includes the block of shared memory and a plurality of processor devices configured to perform different respective functions of the network switch device, respective sets of banks among the plurality of single port memory banks to processor devices among the plurality of processor devices, the block of shared memory being shared among a plurality of processor devices; determining, by the memory controller, respective configurations of the sets of memory banks as one of i) a single port configuration in which respective single port memory banks support a single read or write memory operation to a memory location in a memory access cycle, and ii) a virtual multi-port configuration in which respective single port memory banks support two or more concurrent read or write memory operations to a same memory location, based on memory access requirements of the corresponding processor device; and configuring, by the memory controller, a connectivity controller of the network switch device to couple the plurality of processor devices to the block of shared memory and provide the respective processor devices with access to the corresponding sets of banks according to the determined configurations.

DETAILED DESCRIPTION

Figure 1:
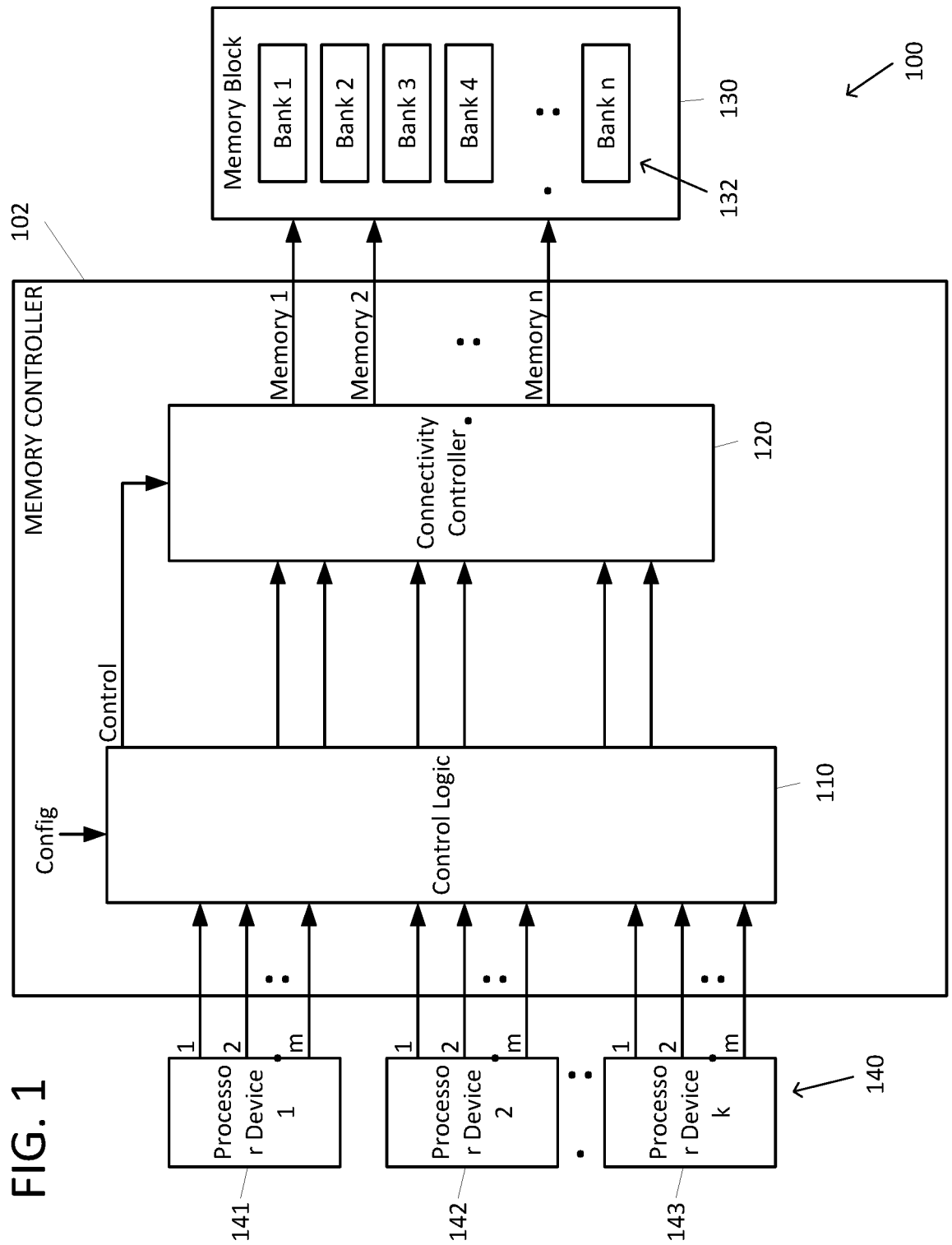
FIG. 1 is a block diagram of an example network switch device having a shared memory block, according to an embodiment.

Various embodiments of a network switch device that utilizes multiple processor devices to concurrently process packets are described herein. In some embodiments, the multiple processor devices are arranged in multiple processor pipelines, each pipeline having one or more processor devices, and the multiple processor devices are configured to use a shared memory. Memory banks are configured to be accessed using one or more memory ports. Basic memory banks typically have one memory port ("single port"), which generally allows for one memory access per clock cycle, while more advanced memories have two memory ports ("dual port") or more than two memory ports ("multi-port"), which generally provide for two or more memory accesses per clock cycle. However, dual port and multi-port memories, whether the ports are physical or virtual, typically have a higher cost and/or complexity and/or reduced capacity in comparison to single port memories, thus dual port and multi-port memories are less desirable in some scenarios, particularly when their additional capability is not necessary for a particular application.

The network switch device includes a memory controller and a block of shared memory having a plurality of single port memory banks, in various embodiments. The memory controller is configured to share the block of shared memory among the plurality of processor engines, which in an embodiment are coupled together to form one or more packet processing pipelines, or among a plurality of processors, and to provide the processor engines with access to the single port memory banks in accordance with a suitable memory configuration, in an embodiment. The memory controller determines a memory configuration for a processor device based on memory access requirements of the processor device, in various embodiments, for example, as a function of the nature of operations that need to be performed by the processing engines that need to access the shared memory and/or of the type of data to be stored in the memory. Examples of the memory configurations include one or more of a single port configuration, a virtual multi-port configuration, and a dual single port configuration, in various embodiments. The different memory configurations respectively provide different memory performance parameters, even though the same single port memory banks are utilized for the different memory configurations. In an embodiment, for example, a single port configuration provides a larger address space but lower access frequency (i.e. a lesser ability by plural devices to access a same memory space in a given clock cycle) as compared to a virtual multi-port (e.g., virtual dual port) configuration. Similarly, a single port memory may be able to more readily provide repeated read and/or write access to a same addressable memory location in consecutive clock cycles than a dual port or multi-port memory. Moreover, the provision of virtual dual-port or virtual multi-port functionality may require the dedication of some memory cells, for example within a block of memory assigned to a specific processing engine, to temporarily store data, such as parity data needed for dual or multi-port functionality, and/or to enable access in consecutive clock cycles, thereby reducing the size of available memory. In some embodiments, the memory controller determines different configurations of memory banks for different processor devices according to the requirements of the processor devices to access memory space in order to provide a particular functionality.

FIG. 1 is a simplified block diagram of an example network switch device 100, according to an embodiment. The network switch device 100 includes a memory controller 102, one or more blocks of shared memory 130, and a plurality of processor devices 140, such as processor engines in a packet processing pipeline. The plurality of processor devices 140 are configured to perform different respective functions of the network switch device 100. In the embodiment shown in FIG. 1, the plurality of processor devices 140 (referred to herein as processor devices 140) includes an integer number k processor devices, shown as processor device 1 (141), processor device 2 (142), and processor device k (143). In various embodiments, the integer number k is 1, 2, 3, 16, 64, or another suitable number. The processor devices 140 utilize the blocks of shared memory 130 to provide the functions of the network switch device 100. Examples of the processor devices 140 include longest exact match engines for routing, tunnel start engines, longest prefix match (LPM) engines, address resolution protocol (ARP) engines, forwarding table lookups (e.g., forwarding database and/or media access control table) that determine egress ports of the network switch device (not shown) for packets, policer engines that limit input or output transmission rates, and other suitable processor devices. In some embodiments, the processor devices 140 provide different functions. In an embodiment, for example, the processor device 141 is a longest exact match engine, the processor device 142 is a forwarding table lookup engine, and the processor device 143 is a policer engine. In another embodiment, both the processor device 141 and the processor device 142 are longest exact match engines and the processor device 143 is a policer engine. In other embodiments, the network switch device 100 includes a different combination of processor devices.

The blocks of shared memory 130 (also referred to herein as a "memory block 130") includes a plurality of single port memory banks 132. In the embodiment shown in FIG. 1, the plurality of single port memory banks 132 (referred to herein as memory banks 132) includes an integer number n of memory banks, shown as bank 1, bank 2, bank 3, bank 4, and bank n. In various embodiments, the integer number n is 2, 3, 8, 16, or any other suitable number. In some embodiments, the network switch device 100 includes only single port memory banks, such as the memory banks 132. In other embodiments, the network switch device 100 includes single port memory banks 132, as well as other, multi-port memory banks (e.g., dual port memory banks). Although only a single memory block 130 is shown in FIG. 1, the network switch device 100 includes two, three, or more memory blocks in other embodiments.

The memory controller 102 is configured to cause access to the memory block 130 to be shared among the processor devices 140, in various embodiments. For example, the memory controller 102 is configured to allocate respective sets of banks among the memory banks 132 to the processor devices 140. In an embodiment, for example, the memory block 130 includes 24 banks and the memory controller 102 allocates a set of eight memory banks to processor device 141, allocates six memory banks to processor device 142, and allocates ten memory banks to processor device 143. In another embodiment, for example, the memory block 130 includes 16 banks and the memory controller 102 allocates a first set of eight memory banks to processor devices 141 and 142 and allocates a second set of eight memory banks to processor device 143.

The memory controller 102 is configured, in an embodiment, to determine respective configurations of the sets of memory banks as one of i) a single port configuration in which respective single port memory banks support a single read or write memory operation to a memory location (e.g., within a same bank) in a memory access cycle, and ii) a virtual multi-port configuration in which respective single port memory banks support two or more concurrent read or write memory operations to a same memory location (e.g., within a same bank), based on memory access requirements of the corresponding processor device, in various embodiments. In some embodiments, the memory controller 102 is configured to both allocate sets of memory blocks 130 and/or memory banks 132 to one or more processor devices 140 as well as determine the respective configurations of the memory banks 130. Although the memory banks 132 are single port memory banks and are individually capable of executing no more than a single read command or a single write command per clock cycle (or memory access cycle), the memory controller 102 is configured, in some embodiments and/or scenarios, to execute multiple memory operations (e.g., a read command or write command) per memory access cycle by utilizing virtual multi-port configurations, as described herein. In various embodiments, the virtual multi-port configurations provide a larger number of read and/or write commands per memory access cycle. In some embodiments, the multi-port configurations include those described in U.S. Pat. No. 8,514,651 entitled "Sharing Access to a Memory Among Clients," U.S. Pat. No. 10,089,018 entitled "Multi-Bank Memory with Multiple Read Ports and Multiple Write Ports Per Cycle," U.S. Patent Application Publication No. 2016/0320989 entitled "Multi-Bank Memory with One Read Port and One or more Write Ports Per Cycle," U.S. Patent Application Publication No. 2016/0321184 entitled "Multiple Read and Write Port Memory," and U.S. Patent Application Publication No. 2017/0364408 entitled "Multiple Read and Write Port Memory," the contents of which are incorporated herein by reference in their entirety. In some embodiments, the memory controller 102 is configured to provide a multi-port configuration in which respective single port memory banks support two concurrent read or write memory operations to a same memory location, based on memory access requirements of the corresponding processor device.

The memory controller 102 includes control logic 110 and a connectivity controller 120, in an embodiment. The control logic 110 is a processor implemented on an integrated circuit for example, using one or more application-specific integrated circuits (ASICs), programmable logic devices (PLDs), or other discrete hardware components. The control logic 110 is coupled with the plurality of processor devices 140, where each of the processor devices 140 has one or more (up to an integer m) memory connections, in an embodiment. The control logic 110 is configured to allocate respective sets of banks to the processor devices 140, and to determine the respective configurations of the sets of memory banks based on memory access requirements of the corresponding processor device. In an embodiment, the control logic 110 receives a user configuration ("Config") that identifies the memory access requirements of the processor devices 140. In an embodiment, the user configuration includes an indication of an estimated memory size requirement and/or an estimated average frequency of access for a processor device. In an embodiment, the user configuration indicates the following requirements:

|  | Number of Memory Accesses | Total Memory Size |
| --- | --- | --- |
| Engine 1 | 4 | 32 KB |
| Engine 2 | 16 | 128 KB |
| Engine 3 | 8 | 64 KB |

In another embodiment, the user configuration indicates the following requirements:

|  | Number of Memory Accesses | Total Memory Size |
| --- | --- | --- |
| Engine 1 | 8 | 64 KB |
| Engine 2 | 4 | 32 KB |
| Engine 3 | 8 | 64 KB |

In other embodiments, the user configuration indicates a device type of the processor devices 140. In one such embodiment, the control logic 110 is configured to determine the memory access requirements using the device type where the device type is one of a plurality of different device types that correspond to respective predetermined memory access requirements.

In an embodiment, for example, a device type such as a forwarding table lookup engine or other processor device having a more chaotic pattern of access corresponds to a multi-port configuration that provides a relatively higher number of concurrent memory read accesses per cycle. Such a requirement may occur for example in the context of memory that is used to store forwarding tables which may need to be concurrently accessed by several processing engines to make forwarding decisions for incoming network packets. A suitable configuration for such use may be a virtual multi-port system that facilitates multiple concurrent read accesses at any given memory address. For some device types, it may be desirable to facilitate, in addition to concurrent read operation, the ability to also perform concurrent or interleaved write operations. In still another example, a device type, such as a packet buffer, that is configured to store packets while packet headers are being processed for a fixed time period, typically has a more systematic and orderly expected pattern of access, for which a single port configuration offering a relatively lower number of memory accesses per cycle, but providing memory that is more dense per unit area may be more suitable.

The connectivity controller 120 of the memory controller 102 is configured to couple the plurality of processor devices 140 with the block of shared memory 130 based on the configuration ("Control") indicated by the control logic 110. In an embodiment, the connectivity controller 120 includes n memory access ports that correspond to the n memory banks of the memory block 130. In an embodiment, the connectivity controller 120 implements a memory connectivity network, such as the memory connectivity network described in U.S. Patent Application Publication No. 2014-0177470, the contents of which are incorporated herein by reference in their entirety. In various embodiments, the control logic 110 determines the memory access requirements of the processor devices 140 during a configuration stage (e.g., during bootup) of the network switch device 100 that precedes an operational stage (e.g., while processing packets) and configures the connectivity controller 120 accordingly. In some embodiments, a same memory bank is part of a different memory configuration at different times. In an embodiment, for example, a memory bank is utilized in single port configuration for a first operational stage of the network switch device, but utilized in a virtual dual port configuration for a second operational stage of the network switch device.

Figures 2A, 2B:
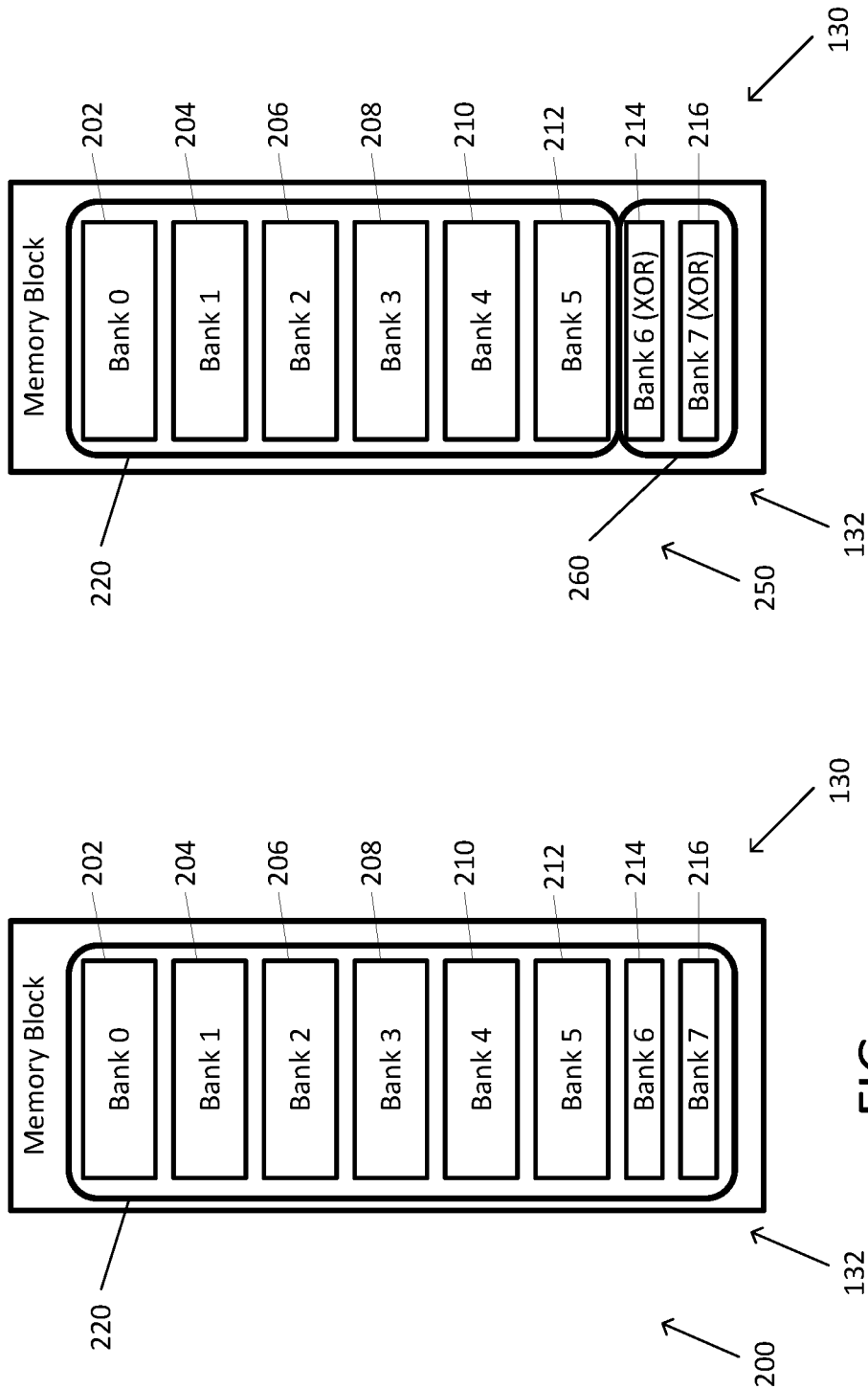
FIG. 2A is a diagram of an example single port configuration of the memory block of FIG. 1, according to an embodiment.
FIG. 2B is a diagram of an example virtual dual port configuration of the memory block of FIG. 1, according to an embodiment.
Figure 3:
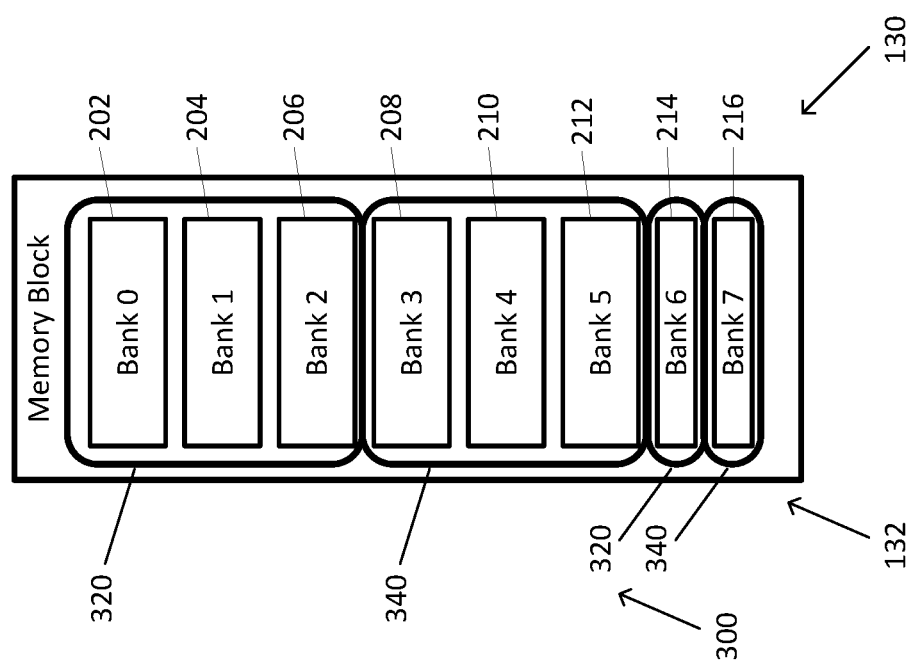
FIG. 3 is a diagram of an example dual single port configuration of the memory block of FIG. 1, according to an embodiment.

FIG. 2A is a diagram of an example single port configuration 200 of the memory block of FIG. 1, according to an embodiment. FIG. 2B is a diagram of an example virtual dual port configuration 250 of the memory block of FIG. 1, according to an embodiment. FIG. 3 is a diagram of an example dual single port configuration 300 of the memory block of FIG. 1, according to an embodiment. In the embodiments shown in FIGS. 2A, 2B, and 3, the plurality of memory banks 132 in a memory block 130 includes eight single port memory banks 202, 204, 206, 208, 210, 212, 214, and 216. The memory banks 214 and 216 are one half of the capacity of the remaining memory banks to allow for the dual single port configuration 300, as described below. In an embodiment, for example, the memory banks 202, 204, 206, 208, 210, and 212 are single port memory banks each having a storage capacity of 2048 address spaces (e.g., addresses of 0 to 2047) and the memory banks 214 and 216 are single port memory banks having a storage capacity of 1024 address spaces (e.g., addresses of 0 to 1023). In various embodiments, each address space corresponds to a single bit, a multi-bit word (e.g., two, three, or more bits), one byte (8 bits), multiple bytes, or any other suitable data size. In some embodiments, half-size memory banks 214 and 216 are omitted and the plurality of memory banks 132 includes only memory banks having a same size.

In the embodiment of the single port configuration 200 shown in FIG. 2A, the memory controller 102 provides a single memory access (i.e., a single read operation or a single write operation) per memory access cycle with a single addressable memory space. In an embodiment, for example, the memory controller 102 allocates a set of memory banks to a processor device and designates each bank of the set of banks as a content data bank and stores content data (e.g., control tables, forwarding tables, routing tables, or other suitable data). In this embodiment, the set of memory banks includes the plurality of memory banks 132 and content data banks 220 include each of the memory banks 202, 204, 206, 208, 210, 212, 214, and 216. In this embodiment, the addressable memory space covers each bank of the set of memory banks and has a size of 14K addressable spaces (i.e., 2048*6=12 k for banks 0-5 and 1024*2=2 k for banks 7 and 8). In an embodiment, the memory controller 102 maps addresses of 0-2047 to the first memory bank 202 (Bank 0), maps addresses of 2048-4095 to the second memory bank 204 (Bank 1), and so on. In this way, the block of shared memory 130 is addressable using an address of 0-2047 along with an offset that corresponds to the appropriate memory bank (i.e., an offset of "0" for Bank 0, an offset of "2048" for Bank 1, etc.). In the single port configuration 200 shown in FIG. 2A, the memory controller 102 maps addresses of 12 k to 13 k-1 to Bank 6 and maps addresses of 13 k to 14 k-1 to Bank 7.

In the embodiment of the virtual dual port configuration 250 shown in FIG. 2B, the memory controller 102 provides two memory accesses per memory access cycle with a single addressable memory space. In an embodiment, for example, the memory controller 102 allocates a set of memory banks to a processor device and designates i) at least one bank of the set of banks as a parity bank 260, and ii) remaining banks of the set of banks as content data banks 220. In this embodiment, the set of memory banks includes the plurality of memory banks 132, the content data banks 220 include memory banks 202, 204, 206, 208, 210, and 212, and the parity banks 260 include memory banks 214 and 216. In this embodiment, the addressable memory space covers the content data banks and has a size of 12K addressable spaces (i.e., 2048*6 for banks 0-5), while the memory banks 214 and 216 are not used for content data.

In an embodiment, the parity banks 260 store an "exclusive OR" ("XOR") of the content data stored in the content data banks at the same memory address. When both of the virtual memory ports attempt to access a same memory bank, a first memory access is read from the bank while the second memory access is read from the remaining banks including the parity banks and performing an XOR to obtain the desired data. In an embodiment, as an example, the processor device 141 requests two read operations on address locations "2060" and "2066" during a same memory access cycle. These address locations are both located within (e.g., mapped to) a same memory bank 204 (i.e., bank 1). In an embodiment, for example, the memory controller 102 performs a first read operation (e.g., at address 12, which is 2060 minus the offset of 2048 for Bank 1) on the bank 204 and performs a second read operation (e.g., at address 18, which is 2066 minus the offset of 2048 for Bank 1) along with an XOR operation on the remaining content data banks 202, 206, 208, 210, 212, and the parity bank 214. In other words, the memory controller 102 reconstructs the content data at mapped address 18 of Bank 1 (corresponding to address 2066) by performing Bank0(18) XOR Bank2(18) XOR Bank3(18) XOR Bank4(18) XOR Bank5(18) XOR Bank6(18), where "Bank0(18)" represents the content data at address 18 of Bank 0, etc. As another example, the memory controller 102 reconstructs the content data at mapped address 1030 of Bank 4 (corresponding to address 9222, or 1030 plus an 8 k offset for Bank 4) by performing Bank0(1030) XOR Bank1(1030) XOR Bank2(1030) XOR Bank3(1030) XOR Bank5(1030) XOR Bank7(6). In this example, an additional offset of 1024 is applied for Bank 7 to account for the reduced sizes of Bank 6 and Bank 7, which have only 1024 addresses.

In a related configuration, in some embodiments, it may be necessary to provide concurrent access to more than two processor engines. In such a case, in accordance with various virtual multi-port virtualization techniques described for example in U.S. Pat. No. 8,514,651, incorporated herein by reference, additional XOR banks are selectably provided for example to hold parity data for rows, columns and/or corner locations of memory banks for those memory banks configured as virtual multi-port memories. Although additional concurrent access can be provided in such implementations, an increased quantity of XOR banks further reduces available memory space for holding data such as forwarding tables.

In the embodiment of the dual single port configuration 300 shown in FIG. 3, the memory controller 102 provides two memory accesses per memory access cycle with two distinct addressable memory spaces. In an embodiment, for example, the memory controller 102 allocates a set of memory banks to a processor device, designates a first portion (or sub-block) of the set of banks as first content data banks having a first address space, and designates a second, remaining portion (or sub-block) of the set of banks as second content data banks having a second address space that is distinct from the first address space. In this embodiment, the set of memory banks includes the plurality of memory banks 132, the first content data banks 320 includes memory banks 202, 204, 206, and 214, and the second content data banks 340 includes memory banks 208, 210, 212, and 216. In an embodiment, for example, the first address space has a size of 7K addressable spaces (i.e., 2048*3 for Banks 0 to Bank 2 plus 1024 for Bank 6), the second address space has a size of 7K addressable spaces (i.e., 2048*3 for Banks 3 to Bank 5 plus 1024 for Bank 7). In this embodiment, the first address space is distinct from the second memory space and the first address space (e.g., addresses 0 to 7 k-1) is accessible to the corresponding processor device by a "first port" and the second address space (e.g., 7 k to 14 k-1) is accessible to the corresponding processor device by a "second port" during a same memory cycle. The dual single port configuration 300 allows the use of the plurality of memory banks 132 as two small (i.e., 7K) memories instead of a single, large (i.e., 14 k) memory, in an embodiment. In some scenarios, the dual single port configuration 300 is utilized (e.g., configured using the user configuration "Config") for engines that require smaller memory banks with improved resolution, such as, for example, longest prefix match (LPM) routing engines. In an embodiment, for example, the memory controller 102 configures a set of memory banks for an LPM routing engine with a relatively high number of memory ports to the shared memory (28 memory ports corresponding to 28 memory banks arranged as 14 instances of the configuration shown in FIG. 3, for example). In some use cases, the LPM routing engine need only be connected to relatively small banks (e.g., 7 k instead of 14 k), so the dual single port configuration 300 allows improved utilization of the shared memory 130, for example, by avoiding the need to allocate a full-size block 130 having more capacity (e.g., 28*14 k) than the LPM routing engine needs.

By switching memory configurations of the memory banks 132 between the configurations 200, 250, and 300, the logic control 110 avoids memory banks being "wasted" as a parity bank when the increased access frequency provided by the parity bank is not needed, in some embodiments. Example embodiments of engines (e.g., processor devices 140) and configurations are defined in Table 1 below:

TABLE 1

| Engine | Required ports | Access type | Attributes | Memory configuration |
|---|---|---|---|---|
| ARP + Tunnel Start | Dual | Random Access Read x2 | ARP and TS can be mapped to same bank | Virtual dual port (XOR) |
| MAC table (FDB) | Dual x16 | Random Access Read x16 x2, Write x2 | 2 interfaces, each having 16x addresses | Virtual dual port (XOR) |
| LPM | Single x28 | Read x28 | Many banks | Single port, Dual single port |
| Exact Match | Dual x16 | Random Access Read x16 x2, Write x2 | 2 interfaces, each having 16x addresses | Virtual dual port (XOR) |

In the example embodiments shown in Table 1, the memory controller 102 configures a set of memory banks using the virtual dual port configuration 250 for the address resolution protocol (ARP) routing engine and tunnel start engine. In an embodiment, the ARP routing engine and the tunnel start engine can be mapped to a same bank and the virtual dual port configuration 250 allows for their concurrent access. In various embodiments, the ARP engine is provided without the tunnel start engine, the ARP engine is provided with an IPv4 tunnel start engine, or an IPv6 tunnel start engine without the ARP engine.

In an embodiment, the memory controller 102 configures the block of shared memory 130 as single port memory banks supporting only a single memory access operation in a given memory access cycle, but having a plurality of separately addressable memory locations, for example, 16 of the single port memory banks 132, using the virtual dual port configuration 250 for the MAC table. In other words, the memory controller 102 configures the content data banks 220 to include 16 separate memory banks. This configuration improves random access reads, for example, for MAC source address and MAC destination address lookups, which may hit a same memory bank. In an embodiment, the memory controller 102 configures the block of shared memory 130 (or another block of shared memory, not shown) using the virtual dual port configuration 250 for an exact match engine, in a manner similar to that provided for the MAC table engine. This configuration improves random access reads, for example, for exact match searches that may hit a same memory bank.

In an embodiment, the memory controller 102 configures the block of shared memory 130 as dual single port memory banks, each memory bank supporting only a single memory access operation in a given memory access cycle, using the dual single port configuration 300 for the longest prefix match (LPM) engine. In an embodiment, the dual single port configuration 300 for the LPM engine includes 28 groups of content data banks, for example, 14 instances of the first content data banks 320 and second content banks 340.

Figure 4:
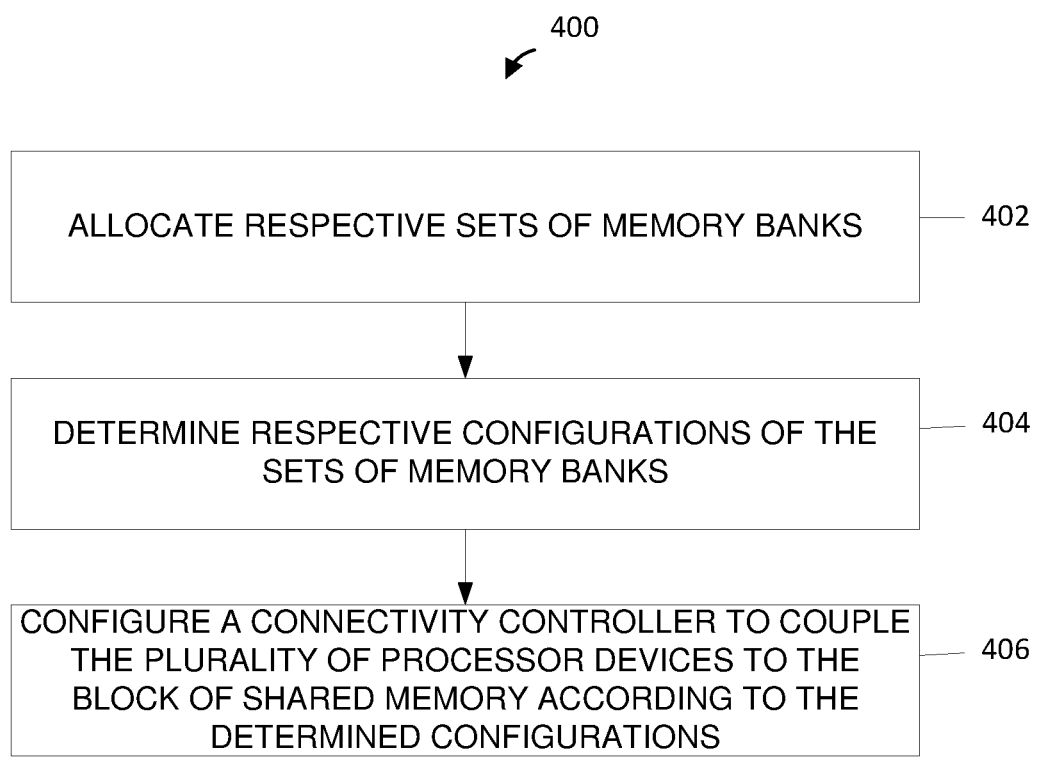
FIG. 4 is a diagram illustrating an example method for providing access to a shared memory block having a plurality of single port memory banks, according to an embodiment.

FIG. 4 is a flow diagram illustrating an example method 400 for providing access to a shared memory block having a plurality of single port memory banks, according to an embodiment. In an embodiment, the method 400 is implemented by a memory controller of a network switch device. With reference to FIG. 1, the method 400 is implemented by the memory controller 102, in an embodiment. For example, in one such embodiment, the control logic 110 is configured to implement the method 400. In the method 400, a memory controller of a network switch device includes the block of shared memory and a plurality of processor devices configured to perform different respective functions of the network switch device. In an embodiment, the network switch device is the network switch device 100.

At block 402, respective sets of banks are allocated by the memory controller among the plurality of single port memory banks to processor engines among the plurality of processor engines. The block of shared memory is shared among a plurality of processor devices.

At block 404, respective configurations of the sets of memory banks are determined by the memory controller as one of i) a single port configuration in which respective single port memory banks support a single read or write memory operation to a memory location in a memory access cycle, and ii) a virtual dual port or multi-port configuration in which respective single port memory banks support two or more concurrent read or write memory operations to a same memory location, based on memory access requirements of the corresponding processor device. In an embodiment, the single port configuration corresponds to the single port configuration 200 of FIG. 2 and the virtual multi-port configuration corresponds generally to the virtual dual port configuration 300 of FIG. 3.

In some embodiments, determining the respective configurations of the sets of memory banks includes determining the respective configurations based on one or more of i) an estimated memory size requirement of the corresponding processor device, and ii) an estimated average frequency of access to the block of memory by the corresponding processor device. In an embodiment, for example, the memory controller 102 determines the configuration as the single port configuration 200 for a processor device having i) a relatively high estimated memory size requirement, or ii) a relatively low frequency of access.

In an embodiment, determining the respective configurations of the sets of memory banks includes determining the memory access requirements of the plurality of processor devices during a configuration stage of the network switch device that precedes an operational stage of the network switch device. For example, the memory controller 102 determines the configurations of the sets of memory banks during a bootup stage before the network switch device 100 begins processing packets.

In some embodiments, determining the respective configurations of the sets of memory banks includes determining the memory access requirements using a device type of the processor device. In an embodiment, for example, the device type is one of a plurality of different device types that correspond to respective predetermined memory access requirements.

At block 406, a connectivity controller of the network switch device is configured by the memory controller to couple the plurality of processor devices to the block of shared memory and provide the respective processor devices with access to the corresponding sets of banks according to the determined configurations. In an embodiment, the connectivity controller corresponds to the connectivity controller 120 of the network switch device 100.

In some embodiments, when the memory controller 102 determines the configuration of the set of banks as the single port configuration, the memory controller 102 designates each bank of the set of banks as a content data bank, and provides an address space that covers each bank of the set of banks to the corresponding processor device.

In some embodiments, when the memory controller 102 determines the configuration of a set of banks as a virtual dual port or virtual multi-port configuration, the memory controller 102 designates i) at least one bank of the set of banks as a parity bank, and ii) remaining banks of the set of banks as content data banks. The content data banks store content data and the parity bank storing parity data that is associated with the content data banks and different from the content data. The memory controller 102 provides an address space that includes the content data banks and omits the parity bank to the corresponding processor device.

In some embodiments, the memory controller 102 allocates the set of banks as a dual single port configuration, including designating a first portion of the set of banks as first content data banks having a first address space and designates a second, remaining portion of the set of banks as second content data banks having a second address space that is distinct from the first address space, and providing the first and second address spaces to the corresponding processor device, the first content data banks supporting concurrent memory operations with the second content data banks during the memory access cycle.

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored in any computer readable memory such as on a magnetic disk, an optical disk, or other storage medium, in a RAM or ROM or flash memory, processor, hard disk drive, optical disk drive, tape drive, etc. The software or firmware instructions may include machine readable instructions that, when executed by one or more processors, cause the one or more processors to perform various acts.

When implemented in hardware, the hardware may comprise one or more of discrete components, an integrated circuit, an application-specific integrated circuit (ASIC), a programmable logic device (PLD), etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A network switch device, comprising:
    a plurality of processor devices configured to perform different respective functions of the network switch device;
    blocks of shared memory, each block having a plurality of single port memory banks, the blocks of shared memory being shared among the plurality of processor devices;
    a memory controller configured to
        allocate blocks of the shared memory to processor devices among the plurality of processor devices, and
        determine, based on memory access requirements of a corresponding processor device, respective configurations of the allocated blocks as one of
            i) a single port configuration that uses each single port memory bank of the corresponding allocated block and supports a single read or write memory operation to the corresponding allocated block in a memory access cycle from a first access port,
            ii) a virtual dual-port configuration that uses each single port memory bank of the corresponding allocated block and supports two concurrent read or write memory operations to the corresponding allocated block in the memory access cycle from the first access port and a second access port, and
            iii) a dual single port configuration that uses each single port memory bank of the corresponding allocated block, wherein the memory controller divides the single port memory banks of the corresponding allocated block into first and second sub-blocks and supports, during the memory access cycle, a single read or write memory operation to the first sub-block from the first access port and a single read or write memory operation to the second sub-block from the second access port.

2. The network switch device of claim 1, wherein the memory controller is configured to determine the respective configurations based on one or more of i) an estimated memory size requirement of the corresponding processor device, and ii) an estimated average frequency of access to the block of memory by the corresponding processor device.

3. The network switch device of claim 1, wherein the memory controller is configured to determine the memory access requirements of the plurality of processor devices during a configuration stage of the network switch device that precedes an operational stage of the network switch device.

4. The network switch device of claim 1, wherein the memory controller is configured to determine the memory access requirements using a device type of the processor device, wherein the device type is one of a plurality of different device types that correspond to respective predetermined memory access requirements.

5. The network switch device of claim 4, wherein the memory controller is configured to determine a configuration of an allocated block as the virtual dual-port memory when the device type, of the processor device to which the allocated block is allocated, corresponds to a forwarding table lookup engine.

6. The network switch device of claim 1, wherein when the memory controller determines the configuration of the allocated block as the single port configuration, the memory controller designates each single port memory bank of the allocated block as a content data bank and provides, via the first access port, a contiguous address space that covers each single port memory bank of the allocated block to the corresponding processor device.

7. The network switch device of claim 1, wherein when the memory controller determines the configuration of the allocated block as the virtual dual-port configuration, the memory controller
designates i) at least one bank of the allocated block as a parity bank, and ii) remaining banks of the allocated block as content data banks, the content data banks storing content data and the parity bank storing parity data that is associated with the content data banks and different from the content data, and
provides, via the first and second access ports, a contiguous address space that includes the content data banks and omits the parity bank to the corresponding processor device.

8. The network switch device of claim 1, wherein when the memory controller determines the configuration of the allocated block as the dual single port configuration, the memory controller
designates the first sub-block of the allocated block as first content data banks having a first contiguous address space and designates the second sub-block of the allocated block as second content data banks having a second contiguous address space that is distinct from the first contiguous address space, and
provides the first contiguous address space to a first processor device via the first access port and the second contiguous address space to a second processor via the second access port, the first and second processor devices being different processor devices, the network controller supporting concurrent memory operations to the first content data banks for the first processor device and to the second content data banks for the second processor device during the memory access cycle.

9. The network switch of claim 8, wherein the memory controller is configured to determine the configuration of the allocated block as the dual single port configuration when a device type of the first processor and the second processor corresponds to a longest prefix match engine.

10. The network switch device of claim 1, further comprising:
a connectivity controller configured to couple the plurality of processor devices with the blocks of shared memory;
wherein the memory controller is configured to configure the connectivity controller to provide the respective processor devices with access to the corresponding allocated blocks according to the determined configurations.

11. The network switch device of claim 1, wherein the memory access requirement is at least one of a memory size requirement and an average frequency of access requirement.

12. The network switch of claim 1, wherein:
when the memory controller determines the configuration of the allocated block as the dual single port configuration, the memory controller
designates the first sub-block of the allocated block as first content data banks having a first contiguous address space and designates the second sub-block of the allocated block as second content data banks having a second contiguous address space that is distinct from the first contiguous address space, and
provides the first contiguous address space to a first processor device via the first access port and the second contiguous address space to a second processor via the second access port, the first and second processor devices being different processor devices, the network controller supporting concurrent memory operations to the first content data banks for the first processor device and to the second content data banks for the second processor device during the memory access cycle; and
when the memory controller determines the configuration of the allocated block as the single port configuration, the memory controller designates each single port memory bank of the allocated block as a content data bank and provides, via the first access port, a third contiguous address space that covers each single port memory bank of the allocated block to the corresponding processor device, wherein the third contiguous address space is a same size as a combination of the first and second contiguous address spaces.

13. A method for providing access to blocks of shared memory, each block having a plurality of single port memory banks, the method comprising:
allocating, by a memory controller of a network switch device that includes the blocks of shared memory and a plurality of processor devices configured to perform different respective functions of the network switch device, blocks of the shared memory to processor devices among the plurality of processor devices, the block of shared memory being shared among a plurality of processor devices;
determining, by the memory controller based on memory access requirements of a corresponding processor device, respective configurations of the allocated blocks as one of i) a single port configuration that uses each single port memory bank of the corresponding allocated block and supports a single read or write memory operation to the corresponding allocated block in a memory access cycle from a first access port, ii) a virtual dual-port configuration that uses each single port memory bank of the corresponding allocated block and supports two concurrent read or write memory operations to the corresponding allocated block in the memory access cycle from the first access port and a second access port, and iii) a dual single port configuration that uses each single port memory bank of the corresponding allocated block, wherein the memory controller divides the single port memory banks of the corresponding allocated block into first and second sub-blocks and supports, during the memory access cycle, a single read or write memory operation to the first sub-block from the first access port and a single read or write memory operation to the second sub-block from the second access port; and
configuring, by the memory controller, a connectivity controller of the network switch device to couple the plurality of processor devices to the blocks of shared memory and provide the respective processor devices with access to the corresponding blocks according to the determined configurations.

14. The method of claim 13, wherein determining the respective configurations of the allocated blocks comprises determining the respective configurations based on one or more of i) an estimated memory size requirement of the corresponding processor device, and ii) an estimated average frequency of access to the block of memory by the corresponding processor device.

15. The method of claim 13, wherein determining the respective configurations of the allocated blocks comprises determining the memory access requirements of the plurality of processor devices during a configuration stage of the network switch device that precedes an operational stage of the network switch device.

16. The method of claim 13, wherein determining the respective configurations of the allocated blocks comprises determining the memory access requirements using a device type of the processor device, wherein the device type is one of a plurality of different device types that correspond to respective predetermined memory access requirements.

17. The method of claim 16, wherein determining the memory access requirements using the device type of the processor device comprises determining a configuration of an allocated block as the virtual dual-port memory when the device type, of the processor device to which the allocated block is allocated, corresponds to a forwarding table lookup.

18. The method of claim 13, the method further comprising:
   when the memory controller determines the configuration of the allocated blocks as the single port configuration,
      designating each single port memory bank of the allocated block as a content data bank that stores content data, and
      providing, via the first access port, contiguous address space that covers each single port memory bank of the allocated block to the corresponding processor device.

19. The method of claim 13, the method further comprising:
   when the memory controller determines the configuration of the allocated block as the virtual dual-port configuration,
      designating i) at least one bank of the allocated block as a parity bank, and ii) remaining banks of the allocated block as content data banks, the content data banks storing content data and the parity bank storing parity data that is associated with the content data banks and different from the content data, and
      providing, via the first and second access ports, contiguous address space that includes the content data banks and omits the parity bank to the corresponding processor device.

* * * * *